United States Patent [19]

Hseih

[11] Patent Number: 4,688,078
[45] Date of Patent: Aug. 18, 1987

[54] PARTIALLY RELAXABLE COMPOSITE DIELECTRIC STRUCTURE

[76] Inventor: Ning Hseih, 1573 Larkin Ave., San Jose, Calif. 95129

[21] Appl. No.: 808,330

[22] Filed: Dec. 11, 1985

Related U.S. Application Data

[63] Continuation of Ser. No. 430,203, Sep. 20, 1982, abandoned.

[51] Int. Cl.$^4$ .............................................. H01L 29/78
[52] U.S. Cl. ..................................... 357/23.5; 357/12; 357/23.15; 357/54; 365/182; 365/185
[58] Field of Search .................... 357/12, 23.5, 23.14, 357/23.15, 23.1, 54; 365/182, 185

[56] References Cited

U.S. PATENT DOCUMENTS

| | | | |
|---|---|---|---|
| 4,336,603 | 6/1982 | Kotecha et al. | 365/182 |
| 4,432,072 | 2/1984 | Chao et al. | 365/182 X |
| 4,535,349 | 8/1985 | Weinberg | 357/23.6 |

FOREIGN PATENT DOCUMENTS

| | | | |
|---|---|---|---|
| 0034653 | 9/1981 | European Pat. Off. | 357/23.5 |
| 0051158 | 5/1982 | European Pat. Off. | 357/23.5 |
| 0083387 | 7/1983 | European Pat. Off. | 357/23.5 |

OTHER PUBLICATIONS

Iizuka et al, "Electrically Alterable Avalanche-Injection-Type MOS Read-Only Memory with Stacked-Gate Structure," *IEE Transactions on Electron Devices*, vol. ED-23, No. 4, Apr. 1976, pp. 379-387.

DiMaria et al, "Electrically-Alterable Memory Using a Dual Electron Injector Structure," *IEE Electron Device Letters*, vol. ED-1, No. 9, Sep. 1980, pp. 179-181.

DiMaria et al, "Dual-Electron-Injector-Structure Electrically Alterable Read-Only-Memory Modeling Studies," *IEEE Transactions on Electron Devices*, vol. ED-28 (1981) Sep., No. 9, pp. 1047-1053.

Johnson et al, "A 16 Kb Electrically Erasable Nonvolatile Memory," IEEE International Solid State Circuits Conference, vol. 23, Feb. 1980, pp. 152-153, 271.

*Primary Examiner*—William D. Larkins
*Assistant Examiner*—William Mintel
*Attorney, Agent, or Firm*—Skjerven, Morrill, MacPherson, Franklin & Friel

[57] ABSTRACT

Unique EPROM and EEPROM devices are provided with a composite dielectric layer between the control gate and the floating gate which is sufficiently thick to provide electrical and physical integrity but also has a high equivalent dielectric constant. The use of the composite dielectric layer alleviates certain problems experienced in the prior art EPROM and EEPROM devices which utilize a polycrystalline silicon floating gate and a polycrystalline silicon control gate separated by an SiO$_2$ dielectric layer, such as the problems of sharp silicon points resulting from polysilicon grain growth causing low dielectric breakdown strength. In contrast to the prior art, a composite dielectric layer serves as a partially relaxable dielectric between the control gate and the floating gate of an EEPROM or an EPROM. The composite dielectric layer provides high capacitance between the floating gate and the control gate without the insulative and breakdown problems encountered with prior art thin dielectric layers. Electron injection takes place through the gate oxide between the drain extension or the floating gate (EEPROM), and between the channel and the floating gate (EPROM). In another embodiment of this invention, the composite dielectric layer is also implemented between the drain extension (EEPROM) or the channel (EPROM) and the floating gate and serves as the tunnel oxide.

16 Claims, 24 Drawing Figures

PARTIALLY RELAXABLE COMPOSITE DIELECTRIC STRUCTURE

This application is a continuation of application Ser. No. 06/430,203, filed Sept. 20, 1982, now abandoned.

BACKGROUND OF THE INVENTION

1. Field of the Invention

This invention relates to a partially relaxable dielectric structure and its application. More particularly, this invention relates to a novel integrated circuit memory structure and the method for making an integrated circuit memory.

2. Description of the Prior Art

Integrated circuit memory devices are known in the prior art. FIG. 1a shows a cross-sectional view of a typical Metal Oxide Silicon (MOS) Electrically Erasable Programmable Read Only Memory (EEPROM) cell 19 capable of storing a single binary digit ("bit"). Cell 19 includes P type substrate 10, N type drain 11b, N type source 11a, channel region 13, floating gate 15, control gate 16, tunnel oxide 12 between floating gate 15 and drain extension 11c, dielectric oxide 18 located between floating gate 15 and control gate 16, field oxide 17, and electrical contacts 14a and 14b. Floating gate 15 is capacitively coupled to control gate 16 through dielectric oxide 18.

To program cell 19 to store a logical "one", the drain 11b is connected to a high voltage (typically approximately 21 volts) through contact 14b, and source 11a is either connected to a small positive voltage (approximately 3 volts) through contact 14a or left unconnected ("floating"). Control gate 16 is connected to ground. The ground voltage on control gate 16 is capacitively coupled to floating gate 15, thereby holding floating gate 15 near ground potential. Because of the high positive voltage placed on drain 11b and drain extension 11c, electrons in the floating gate 15 tunnel through the tunnel oxide 12 into the drain extension 11c, thus leaving a net positive charge on floating gate 15. When programming is complete, floating gate 15 retains this positive charge, thus decreasing the voltage required to be placed on control gate 16 to render cell 19 conductive. Thus cell 19, having a decreased control gate threshold voltage (i.e. the voltage on control gate 16 required to turn cell 19 on), stores a logical one. The control gate threshold voltage for a cell 19 which has been programmed to store a logical one is typically zero or slightly negative (e.g. −3 volts). A cell 19 which is not programmed by placing a positive charge on floating gate 15 has a typical control gate threshold voltage of 1 volt.

To erase cell 19, ground voltage is applied to drain 11b via contact 14b and a high positive erase voltage (typically approximately 20 volts) is applied to control gate 16. Electrons then flow from drain extension 11c through tunnel oxide 12 to floating gate 15 thereby discharging floating gate 15 to zero or to a slightly negative voltage. To turn on erased cell 19, a rather high positive voltage on the control gate 16 is needed and the control gate threshold voltage for an "erased" cell 19 is, for example, approximately +5 volts.

To read cell 19, drain 11b is connected to a small positive voltage (typically approximately 2 volts) and source 11a is grounded. A sense amplifier (not shown) detects the current flowing through drain 11b. A read voltage (typically approximately 2 volts) is placed on control gate 16, which is sufficiently positive to turn on cell 19 when cell 19 stores a logical one (i.e. floating gate 15 is charge positive), but which is not sufficiently positive to turn on cell 19 when cell 19 stores a logical zero (i.e. floating gate 15 is charged to zero or slightly negative). The sense amplifier senses the drain current of cell 19, which in turn indicates if cell 19 is turned on or off, which is determined by the logical state (i.e. logical one or zero) of the bit stored in cell 19. Thus, the data stored in cell 19 is read.

An array of EEPROM cells forming an EEPROM device can be made with supporting peripheral circuitry which allows selective programming, erasing and reading. Such an array is described, for example in "A 16Kb Electrically Erasable Nonvolatile Memory" by W. S. Johnson et al., 1980 IEEE International Solid-State Circuits Conference, P. 152, 1980, which is hereby incorporated by reference.

FIG. 1b shows a typical prior art Erasable Programmable Read Only Memory (EPROM) cell 24, containing a control gate 25, floating gate 26, N type source region 28a, N type drain region 28b, dielectric 27, field oxide 29, gate oxide 30, P type channel 32 and P type substrate 31. To program cell 24, high positive voltages (typically approximately 20 volts) are applied to drain 28b and control gate 25, and source 28a is grounded. The high voltage applied to control gate 25 is capacitively coupled to the floating gate 26, which causes channel 32 to conduct, thus turning cell 24 on. Because of the high drain voltage, a rather large quantity of "hot" electrons are generated in the channel 32, such "hot" electrons having sufficiently high energy to overcome the potential barrier of gate oxide 30. These hot electrons are attracted to and collected by the floating gate 26, which is at a positive potential due to the positive voltage applied to control gate 25. These hot electrons which are collected on the floating gate 26 make the floating gate voltage negative and thus raise the control gate threshold voltage of cell 24 by several volts—and a logical "one" bit is stored in cell 24. To read cell 24, read voltages (typically 2 to 3 volts) are supplied to drain 28b and control gate 25, and source 28a is grounded. The read voltage applied to control gate 25 is such that it is not sufficiently high to turn on cell 24 when cell 24 stores a logical one, but is sufficiently high to turn on cell 24 when cell 24 stores a logical zero. A sense amplifier (not shown) is used in a similar fashion as previously described in conjunction with the EEPROM of FIG. 1a, to sense the data stored in cell 24.

To erase EPROM cell 24, UV (ultra-violet) light is used to illuminate the floating gate 26. The passivation oxide 27 surrounding the floating gate 15 is transparent to UV light. UV light has sufficiently high photon energy to impart sufficient energy to the electrons on the floating gate 26 to cause the electrons to overcome the barrier of oxide 30 and leak out from the floating gate 26 to channel 32, thereby discharging floating gate 26.

An array of EPROM cells forming an EPROM device can be made with supporting peripheral circuitry which allows selective programming and reading. Erase is done for the entire array with UV light illumination. Such an array of EPROM cells is described, for example, by G. Perlegos et al., in "A 64K EPROM using Scaled MOS Technology", 1980 IEEE International Solid-State Circuits Conference, Page 142, 1980, which is hereby incorporated by reference.

In integrated circuit capacitors and more particularly in memory devices, a thin dielectric layer between two conductive layers capacitively couples the conductive layers. For example, in Erasable Programmable Read Only Memory (EPROM) memory cells (FIG. 1b) or Electrically Erasable Programmable Read Only Memory (EEPROM) cells (FIG. 1a), a floating gate (for example floating gate 15 of FIG. 1a) is typically separated from the control gate 16 (FIG. 1a) by a thin dielectric layer 18 of silicon dioxide ($SiO_2$), or silicon nitiride ($Si_3N_4$). It is essential that this dielectric layer is very thin in order that the capacitance between the control gate 16 and floating gate 15 is large compared with the capacitance between the floating gate 15 and other regions (e.g., between floating gate 15 and drain extension 11c), thereby causing the voltage on floating gate 15 to closely follow the voltage on control gate 16, thus allowing a large voltage drop across the tunnel oxide 12 to induce tunneling current during programming and erasing. However, the thin layer of dielectric 18 must be of excellent insulative quality so that the charge stored on the floating gate 15 does not leak out over extended periods of time (i.e. 10 yrs at 125° C.), thereby discharging floating gate 15. Providing a dielectric layer which is both very thin and of excellent insulative quality is very difficult. For instance, when the dielectric layer 18 is made excessively thin (i.e. 500 Angstrom or less,) high capacitance between floating gate 15 and control gate 16 is achieved, but the dielectric integrity and insulation properties of dielectric layer 18 are poor. Thus, if a defect exists in dielectric layer 18, control gate 16 may become electrically connected to floating gate 15, thus causing an electrical failure of the device. Alternatively, the poor insulative quality of dielectric 18 allows undesirable charging or discharging of floating gate 15 via control gate 16. In order to prevent such defects in dielectric layer 18, dielectric layer 18 must be formed to a minimum thickness of about 600–700 Å when $SiO_2$ is used as dielectric 18. The use of this rather thick oxide as dielectric 18 requires a large overlap area between control gate 16 and floating gate 15 in order to achieve the necessary capacitance between floating gate 15 and control gate 16. This large overlap area causes the cell size to be rather large. Large cell size, and thus large device size, is very undersirable in that the product yield rate decreases drastically with an increase in chip size.

Typically, control gate 16 and floating gate 15 are formed for doped polycrystalline silicon (often called "polysilicon" or "poly" for short) because of the well-known advantages of polysilicon gate technology. At leat two problems exist with the use of a "sandwich" formed of polysilicon floating gate 15, $SiO_2$ dielectric 18, and polysilicon control gate 16. One such problem is the asperities (as shown in FIG. 2) which are rough points at the polysilicon/$SiO_2$ interfaces between control gate 16 and dielectric 18, and between dielectric 18 and floating gate 15. As shown in FIG. 2, the presence of sharp points C formed by the uneven distribution of silicon atoms along interfaces A and B causes local high electric field at points C and thus dielectric breakdown problems at sharp points C, even with a relatively low voltage difference between control gate 16 and floating gate 15. The low voltage breakdown at point C amy occur at 3 to 4 times lower voltage compared to a layer of $SiO_2$ of the same thickness but grown on single crystal silicon, rather than on polycrystalline silicon. Another problem present when using the sandwich formed by poly floating gate 15, $SiO_2$ dielectric 18 and poly control gate 16 is caused by the growth of polysilicon grains after oxide formation. These grains are often large enough to punch through the thin dielectric layer 18 (see FIG. 3), thereby causing an electrical short between control gate 16 and floating gate 15 (FIG. 1a). Silicon grains which do not punch through the dielectric layer 18 reduce the thickness of layer 18, and thus reduce the dielectric strength of dielectric layer 18.

One possible way to achieve high capacitance between control gate 16 and floating gate 15 is to form dielectric 18 from materials with dielectric constants greater than the dielectric constant of $SiO_2$, such as tantalum oxide or other oxides so that, for a given capacitance, the dielectric layer 18 made from these materials does not need to be as thin as a dielectric layer 18 formed of $SiO_2$. However, these materials do not have insulation properties as good as silicon dioxide due to poor material composition control and structural instability at high temperatures. Furthermore, the formation of such other oxides are not compatible with current integrated circuit processes and thus such other oxides cannot be easily implemented in nonvolatile integrated circuit memories.

The use of a composite layer of silicon-rich $SiO_2$/$SiO_2$/silicon-rich $SiO_2$ between the floating gate and the control gate of a memory device has been described by D. J. DiMaria et al. in an article entitled, "High Current Injection Into $SiO_2$ Using Si-rich $SiO_2$ Films and Experimental Applications", *The Physics of MOS Insulators*, G. Lucovsky, et al. Ed. 1980. The structure described by DiMaria is shown in FIG. 4a. Dielectric layer 44 is formed between polysilicon control gate 46 and polysilicon floating gate 45. Dielectric layer 44 includes three layers 44a, 44b and 44c as shown in more detail in FIG. 4b. Layers 44a and 44c are formed of silicon-rich silicon dioxide (i.e. silicon dioxide including an abundance of excess silicon atoms), and layer 44b is formed of substantially pure silicon dioxide. The operation of the DiMaria EEPROM shown in FIG. 4a is similar to the prior art EEPROM shown in FIG. 1a with one significant difference: floating gate 45 is charged and discharged through control gate 46, and three layer structure 44 is used to inject tunnelling electrons between control gate 46 and floating gate 45 through dielectric 44 to either charge or discharge floating gate 45, as desired. When floating gate 45 is charged positive by causing electrons to tunnel out of the floating gate 45 through dielectric layer 44 into control gate 46, the control gate threshold voltage of DiMaria's transistor 140 is decreased, thus storing a logical one. Conversely, when floating gate 45 is discharged by causing electrons to tunnel from control gate 46 through dielectric 44 into floating gate 45, the control gate threshold voltage of DiMaria's transistor 140 is increased, thus storing a logical zero. As described by DiMaria, by forming a thin $SiO_2$ layer between two layers of silicon-rich $SiO_2$, the current injection through the center $SiO_2$ layer is considerably enhanced as compared with the current injection through a single layer of $SiO_2$ having a thickness equal to the center $SiO_2$ layer of the dielectric sandwich. Accordingly, this three layer dielectric structure is sometimes referred to as a "Dual Electron Injector Structure" (DEIS).

SUMMARY OF THE INVENTION

In accordance with the teachings of this invention, a unique EEPROM device and a unique EPROM device are provided with a composite dielectric layer between the control gate and the floating gate which is sufficiently thick to provide electrical and physical integrity but also has a high equivalent dielectric constant. The composite dielectric layer is fabricated using methods which are compatible with the methods used to fabricate integrated circuits in a silicon substrate. The use of the composite dielectric layer in accordance with the teachings of this invention alleviates certain problems experienced in the prior art EPROM and EEPROM devices which utilize a polycrystalline silicon floating gate and a polycrystalline silicon control gate separated by an SiO₂ dielectric layer, such as the problems of sharp silicon points causing low dielectric breakdown strength and the puncturing of the dielectric layer by polysilicon grain growth. In accordance with the teachings of this invention, a memory device includes buffering layers (i.e. layers which buffer abnormally high electric fields at sharp points and prevent polysilicon grain growth from punching through the thin dielectric oxide) of silicon-rich $SiO_2$ between the polysilicon control gate and the silicon dioxide, and between the polysilicon floating gate and the silicon dioxide.

In contrast to the prior art use of a composite dielectric layer as an electron injection structure (equivalent to a tunnel oxide) between the floating gate and the control gate of an EEPROM device, in accordance with one embodiment of this invention, a composite dielectric layer serves as a partially relaxable dielectric between the control gate and the floating gate of an EEPROM or an EPROM. The composite dielectric layer provides high capacitance between the floating gate and the control gate without the insulative and breakdown problems encountered with prior art thin dielectric layers, with electron injection taking place through the gate oxide between the drain extension and the floating gate, (EEPROM), and between the channel and the floating gate (EPROM).

In another embodiment of this invention, the composite dielectric layer is implemented between the drain extension (EEPROM) or the channel (EPROM) and the floating gate and serves as the tunnel oxide, thereby providing increased tunnelling efficiency as compared to prior art structures which utilize a single layer of tunnelling oxide. The invention will be further understood with reference to the detailed description taken together with the drawings.

BRIEF DESCRIPTION OF THE DRAWINGS

FIG. 4b is a detailed cross-sectional view of the DEIS structure of FIG. 4a;

FIG. 5b depicts the charge transfer which occurs when a voltage is applied to the structure of FIG. 5a;

FIGS. 5c–5e are graphical representations of the qualitative behavior of the structure of FIG. 5a;

DESCRIPTION OF THE PREFERRED EMBODIMENTS

Figure 6:
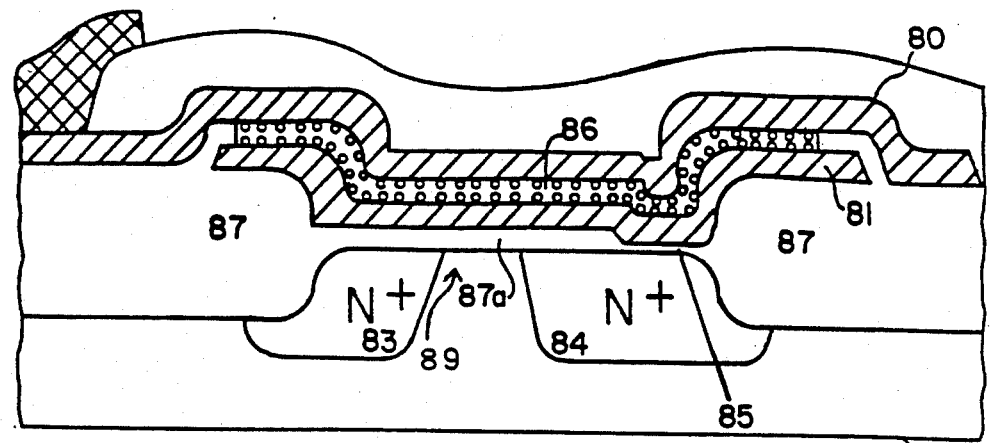
FIG. 6 is a cross-sectional view of an EEPROM constructed in accordance with one embodiment of this invention utilizing a composite dielectric layer between the control gate and the floating gate and a tunnel oxide between the floating gate and the drain.

FIG. 6 shows one embodiment of an EEPROM cell 78 constructed in accordance with this invention. EEPROM cell 78 is formed in P type silicon 79, and includes N type source 83, N type drain 84, channel region 89 field oxide 87, gate oxide 87a, floating gate 81, control gate gate 80, and partially relaxable composite dielectric 86. EEPROM cell 78 also includes tunnel oxide 85 located between N type drain region 84 and floating gate 81. Tunnel oxide 85 allows tunnelling of electrons between floating gate 81 and N type drain region 84 in order to program and erase cell 78, as previously described in conjunction with prior art EEPROMs.

Figure 5A:
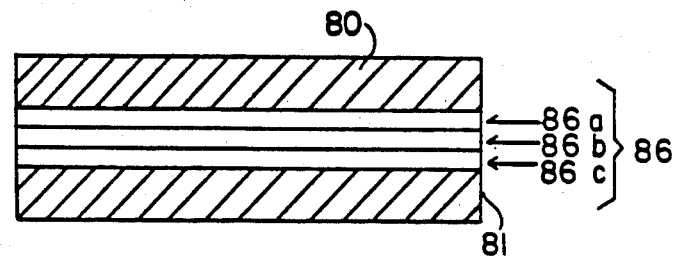
FIG. 5a is a cross-sectional view of two electrical conductors separated by a partially relaxable composite dielectric structure.

Composite dielectric layer 86 formed between control gate 80 and floating gate 81 is shown in more detail in FIG. 5a. Composite dielectric layer 86 is formed of silicon-rich $SiO_2$ layer 86a, $SiO_2$ layer 86b and silicon-rich $SiO_2$ layer 86c. The top and bottom layers 86a and 86c of partially relaxable dielectric 86 are so-called "silicon-rich" $SiO_2$ layers, meaning that layers 86a and 86c have an abundance of free silicon atoms. Although silicon-rich $SiO_2$ layers 86a and 86c are not used for electron injection, as taught by DiMaria, when $SiO_2$ layers 86a and 86c are used as a partially relaxable dielectric in accordance with this invention, silicon-rich $SiO_2$ layers 86a and 86c are preferably formed with a free silicon content in the range of 40 to 65 atomic percent, similar to the free silicon content used by DiMaria, et al. The thickness of the silicon-rich $SiO_2$ layers 86a and 86b is preferably from approximately 150 Å to 500 Å, because thicker layers have longer relaxation times (mroe fully described later) and thinner layers reduce the physical integrity of the composite dielectric layer 86, thus increasing the possibility of a short circuit between control gate 80 and floating gate 81 through composite dielectric layer 86. The center layer 86b of composite dielectric layer 86 is a layer of silicon dioxide, preferably having a thickness within the range of approximately 100 Å to 300 Å. Thicker intermediate layers 86b of $SiO_2$ provide decreased capacitance between control gate 80 and floating gate 81 and thinner layers provide a low dielectric breakdown strength of composite dielectric layer 86.

Figure 5B:
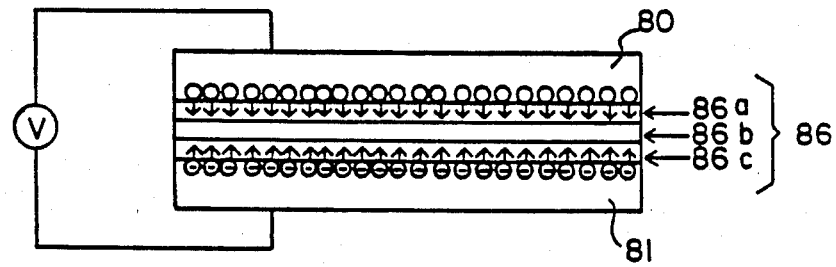

Layers 86a and 86c of silicon-rich $SiO_2$ are referred to as "relaxable" in that, when an electric field is applied between the control gate 81 and floating gate 82, layers 86a and 86c have sufficient conductivity to allow charges from control gate 80 and floating gate 81 to be transported to the upper and lower surfaces, respectively, of layers 86c and 86a in a short period of time (the "relaxation time"), as shown in FIG. 5b, after which any further increase in the magnitude of the electric field will further increase the charge across the dielectric layer 86b, and relaxable dielectric layers 86a and 86c behave electrically as part of control gate 80 and floating gate 81, respectively. DiMaria teaches that a similar sandwich structure is utilized to inject electrons into the floating gate, not as a partially relaxable dielectric to increase capacitive coupling. In contrast to the structure of DiMaria, electrons do not tunnel from control gate 80 to floating gate 81 through dielectric 86 of the present invention because in applicant's invention only a small fraction of the high applied voltage appears across the coupling dielectric 86. This is because the "coupling ratio" (described in more detail later) of the structure 78 is very different from DiMaria's cell 140.

The relaxation time T is defined as the time required after the initial application of a voltage $V_o$ between control gate 80 and floating gate 81 until relaxable dielectric layer 86a and 86c behave electrically as part of the control gate 80 and floating gate 81, respectively. Relaxable dielectric layers 86a and 86c are considered to behave electrically as part of control gate 80 and floating gate 81, respectively, when the voltage across dielectric layer 86b is equal to approximately 95% of the voltage between control gate 80 and floating gate 81. The relaxation time T is inversely proportional to the conductivity of relaxable dielectric layers 86a and 86c. Also, the conductivity of the layers 86a and 86c increases exponentially with the electric field across layers 86a and 86c. Preferably the relaxation time T is made very short by choosing suitable conductivities of relaxable dielectric layers 86a and 86c as determined by the proportion of free silicon atoms within the relaxable dielectric layers 86a, 86c. For example, for a relaxation time T on the order of 10 to 100 microseconds, the required conductivities of relaxable dielectric layers 86a and 86c are met by having a free silicon content of layers 86a and 86c of approximately 40-65%. When relaxation of layers 86a and 86c has occurred, there is a small sustaining electric field in layers 86a and 86c which supports the space charges within the layers 86a and 86c. This sustaining electric field is very small (i.e. much less than $10^6$ volts/cm if layers 86a and 86c have a sufficiently high conductivity, corresponding to a free silicon content of layers 86a and 86c of approximately 50 atomic percent).

Figure 5C:
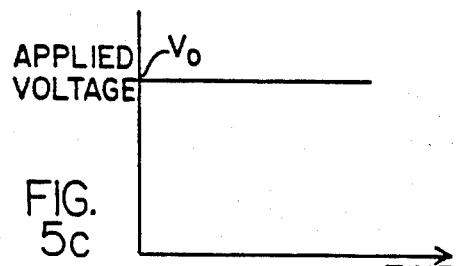
Figure 5E:
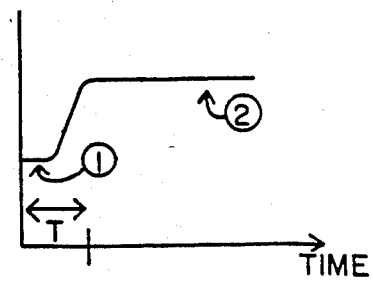
Figure 5D:
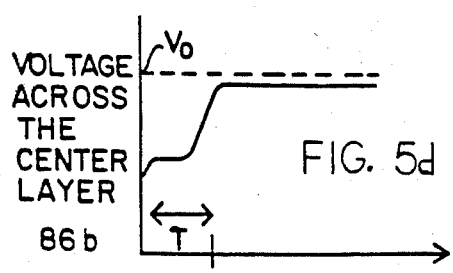

FIGS. 5c, 5d and 5e depict in graphical form the qualitative behavior of the partially relaxable composite dielectric layer 86 of FIG. 5a. After the application of an electric field to dielectric 86 and before relaxation time T has elapsed, layers 86a and 86c are not yet fully relaxed and behave electrically as part of the total dielectric composite layer 86, rather than as part of control gate 80 and floating gate 81, respectively. After relaxation time T has lapsed, layers 86a and 86c are fully relaxed and behave electrically as part of control gate 80 and floating gate 81, respectively, and the dielectric breakdown voltage of the composite dielectric layer 86 is equal to the breakdown voltage of dielectric layer 86b. FIG. 5c shows the voltage $V_o$ applied across the composite dielectric layer 86b of FIG. 5a. FIG. 5d shows the change in voltage across the center dielectric layer 86b with respect to time and FIG. 5e shows the change in capacitance between control gate 80 and floating gate 81 as a function of time after the application at time $t=0$ of a voltage $V_o$ between control gate 80 and floating gate 81. If the relaxation time T and the sustaining voltage $V_{sus}$ (the voltage required to maintain the space charge across layers 86a and 86c) are both small (i.e. T << 10 milliseconds, $V_{sus}$ << 10 volts), the composite dielectric structure 86 is capacitively equivalent (when t > T) to the use of a single layer 86b, even though the total thickness is that of all three layers 86a, 86b and 86c.

Figure 1A:
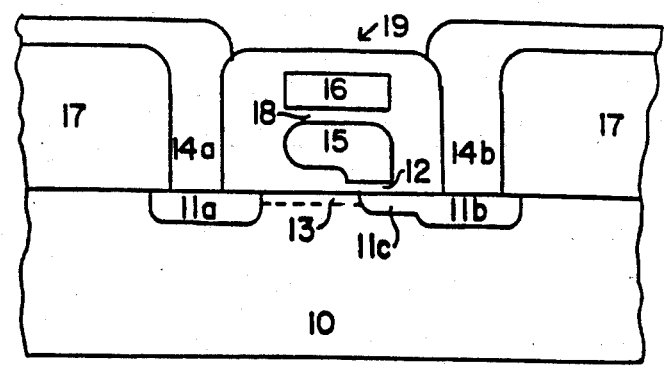
FIG. 1a is a cross-sectional view of a typical prior art EEPROM.

In typical prior art EEPROM devices, the write and erase operations are performed by applying an approximately 20 volt pulse of approximately 10 millisecond duration to control gate 16 of EEPROM 19 of FIG. 1a. In accordance with this invention, the write and erase operations are performed with the composite dielectric layer 86 of FIGS. 5a and 6 used in place of the 600–700 Å layer 18 of $SiO_2$ (FIG. 1) used in prior art EEPROMS. Since excellent physical and electrical integrity is achieved with the composite dielectric structure of FIG. 5a, the center $SiO_2$ layer 86b can be as thin as only 100 Å without losing dielectric integrity. Capacitive coupling between control gate 80 and floating gate 81 of an EEPROM constructed in accordance with the principles of this invention is enhanced by 6 to 7 times as compared to prior art EEPROM structures which utilize a 600–700 Å layer of $SiO_2$ as the dielectric between the control gate and the floating gate.

Figure 1B:
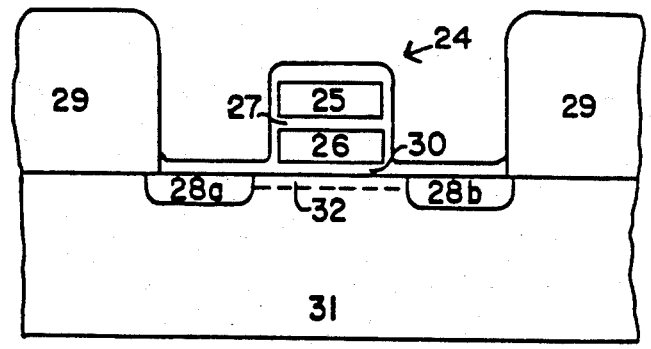
FIG. 1b is a cross-sectional view of a typical prior art EPROM.
Figure 4A:
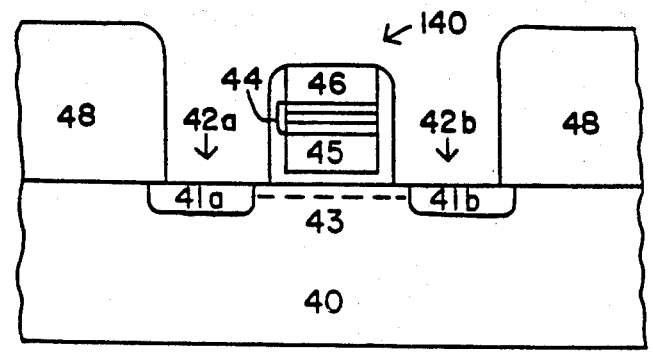
FIG. 4a is a cross-sectional view of a prior art EEPROM incorporating a Dual Electron Injector Structure (DEIS)
Figure 4B:
Figure 3:
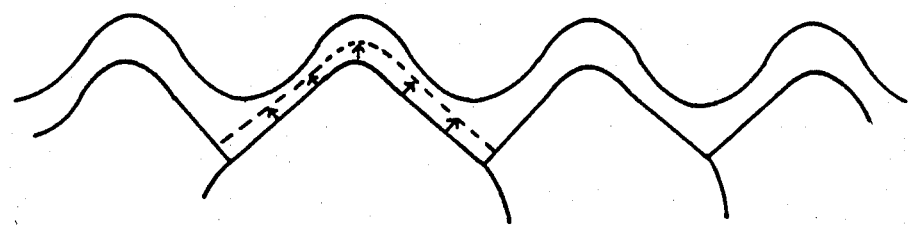
FIG. 3 depicts the growth of silicon grains in a $SiO_2$ region formed adjacent to a polysilicon layer.
Figure 2:
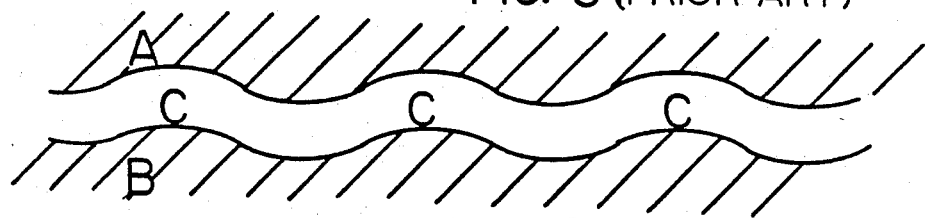
FIG. 2 depicts the mechanism of charge leakage and formation of local high electric fields due to asperities along polysilicon/SiO₂ interfaces.

The silicon-rich $SiO_2$ layer is a two-phase mixture of silicon and $SiO_2$, in that very small silicon particles are dispersed throughout the silicon-rich $SiO_2$ layer. This silicon-rich $SiO_2$ layer is very stable at the high temperatures (typically approximately 1100° C.) often encountered in semiconductor processing. Furthermore, the silicon particles or "grains" formed within the silicon-rich $SiO_2$ layer rapidly reach a saturated size (do not grow further) of about 100 Å because of a limited amount of excess silicon in the oxide, thus limiting silicon grain size to approximately 100 Å. This is in stark contrast to prior art memory structures where large silicon grains may penetrate into the $SiO_2$ layer formed adjacent to polysilicon layers. There is no conglomeration of silicon grains upon further processing of the semiconductor device because silicon atoms have very small diffusivities in oxide, thus preventing the formation of larger silicon grains within the silicon-rich $SiO_2$ layers 86a and 86c or the $SiO_2$ layer 86b (FIG. 5a). Because of the chemical stability of the composite dielectric layer 86, a considerable yield improvement is achieved as compared with the yield of prior art devices utilizing only a single $SiO_2$ dielectric layer between the polysilicon control gate 16 and floating gate 15 (FIG. 1).

In accordance with the present invention, the capacitance $C_1$ between control gate 80 and floating gate 81 (FIG. 6) is enhanced by as much as 6 to 7 times over prior art structures using a single $SiO_2$ dielectric layer between the control gate and the floating gate. If the capacitance between the floating gate 81 and the drain 84 is $C_2$, then the coupling ratio $\eta$ of control gate 80 to floating gate 81, is defined (neglecting parasitic capacitances) as:

$$\eta = C_1/(C_1 + C_2)$$

where
 $\eta$ = control gate 80 to floating gate 81 coupling ratio;
 $C_1$ = capacitance between control gate 80 and floating gate 81;

$C_2$=capacitance between floating gate 81 and drain 84.

For a given capacitance $C_2$ (mostly due to the capacitance provided across tunnel oxide 85 serving as the dielectric between floating gate 81 and drain 84), an increased capacitance $C_1$ provides an increased coupling ratio $\eta$ and hence a lower programming voltage is required to be applied to control gate 80 in order to capacitively couple a given voltage to floating gate 81 to program the cell 78. Alternatively, for a given capacitance $C_2$, an increased capacitance $C_1$ reduces the floating gate 80 area (when viewed from the top of the cell 78) required to achieve a given coupling ratio $\eta$ necessary to allow programming of cell 78 with a given programming voltage applied to control gate 80. This decrased size of floating gate 80 reduces the size of cell 78, thus allowing the fabrication of a memory array comprising a plurality of cells 78 which is more dense than the memory arrays of the prior art.

Referring again to FIG. 5a, the three layer composite dielectric is made, for example, by chemical vapor deposition (CVD) techniques well known in the semiconductor industry. For example, by adjusting the gas flow rate ratio of two active gases $SiH_4$ and $N_2O$ at a CVD reaction temperature of 700° C., layers of silicon-rich $SiO_2$ and pure $SiO_2$ are deposited sequentially. Other methods are also available to fabricate the partially relaxable dielectric 86, for example LPCVD (Low Pressure CVD), which is believed to be the better fabrication method for volume production because of typically better film uniformity. Such LPCVD techniques are described, for example in the article by Rosler entitled "Low Pressure CVD Production Process for Poly, Nitride, and Oxide", *Solid State Technology*, April 1977, pages 63-70.

The silicon-rich $SiO_2/SiO_2$/silicon-rich $SiO_2$ structure is only one composite dielectric which is suitable for use in accordance with the teachings of this invention. Other embodiments of this invention utilize silicon-rich $Si_3N_4$ as a relaxable dielectric. Such embodiments of this invention form a composite dielectric layer of silicon-rich $Si_3N_4/SiO_2$/silicon-rich $Si_3N_4$ or silicon-rich $Si_3N_4/Si_3N_4$/silicon-rich $Si_3N_4$. Methods for fabricating such composite dielectric structures are obviouis to one of ordinary skill in the art in light of the teachings of this specification. For example, CVD processes utilizing $SiH_4$ and $NH_3$ gases can be used for $Si_3N_4$ and Si-rich $Si_3N_4$.

Tunnel oxide 85 in one embodiment of the EEPROM of FIG. 6 is thermal oxide of approximately 100 Å in thickness. In another embodiment, tunnel oxide 85 is a silicon-rich $SiO_2/SiO_2$/silicon-rich $SiO_2$ composite dielectric layer similar to the composite dielectric 86, thus providing enhanced current injection between drain 84 and floating gate 81 as compared to prior art EEPROMs utilizing a single $SiO_2$ layer as tunnel oxide 85, thereby allowing the use of a lower write/erase voltage for programming the cell 78. In this embodiment of my invention, two separate partially relaxable dielectric layers serve two purposes: enhancement of the capacitance between the control gate 80 and floating gate 81, and enhancement of the tunnel current between floating gate 81 and drain 84 during programming and erasure of cell 78. In contrast to DiMaria, electron tunnelling between control gate 80 and floating gate 81 is avoided by the fact that the majority of the write/erase voltage (e.g. 70%) appears across the tunnel oxide 85, and only a small fraction (e.g. 30%) of the voltage appears across the partially relaxable composite dielectric 86.

Figure 7:
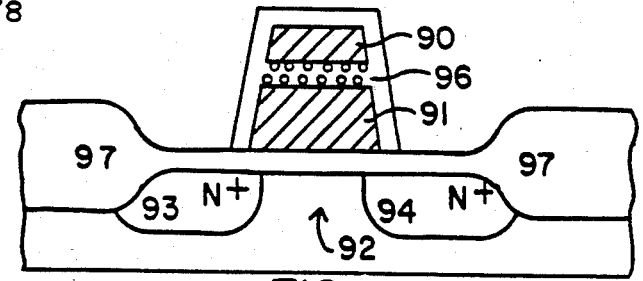
FIG. 7 is a cross-sectional view of an EPROM constructed in accordance with another embodiment of this invention.

One embodiment of an EPROM constructed in accordance with the teachings of the present invention is shown in the cross-sectional view of FIG. 7. In EPROM constructed in accordance with the principles of this invention, partially relaxable dielectric layer 96 formed between polysilicon control gate 90 and polysilicon floating gate 91 greatly enhances capacitive coupling between control gate 90 and floating gate 91, and therefore a lower programming voltage on the control gate 90 can be used, as compared with prior art EPROM devices. Since an EPROM constructed in accordance with this invention can achieve a given capacitance value $C_1$ between floating gate 91 and control gate 90 with much less floating gate area as compared to prior art EPROM cells, a smaller EPROM cell is achieved for a given programming voltage, thereby allowing the formation of more dense arrays of memory cells.

Figure 8A:
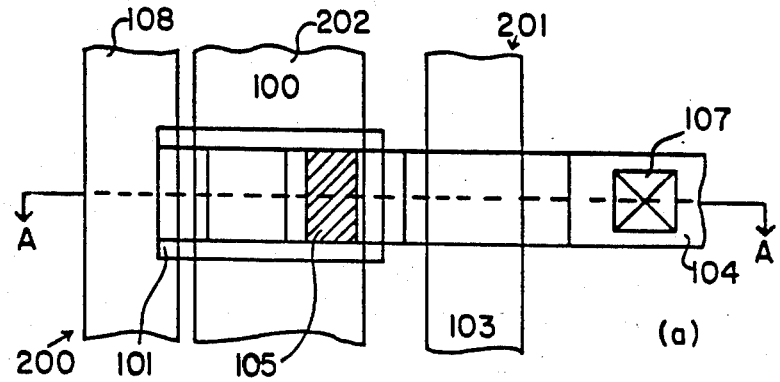
FIGS. 8a and 8b are a plan view and a cross-sectional view, respectively, of a two-transistor EEPROM cell constructed in accordance with one embodiment of this invention.
Figure 8B:
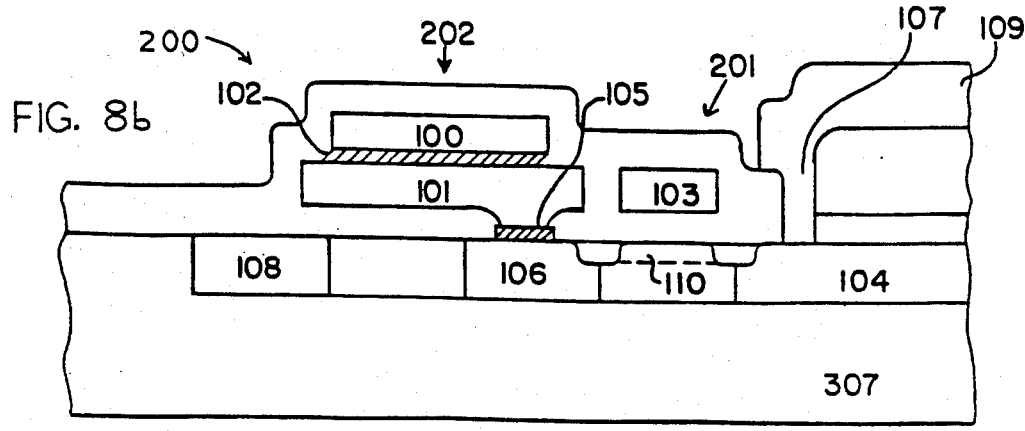
Figure 9:
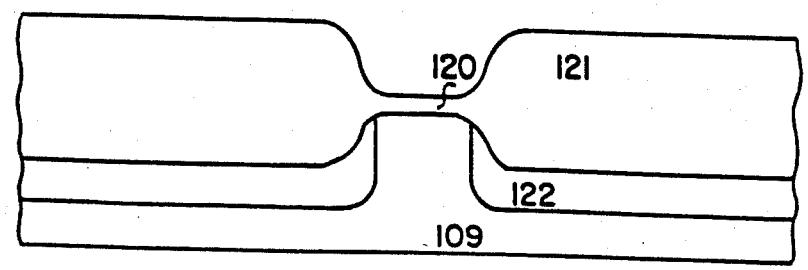
FIGS. 9-17 are cross-sectional views depicting one process for fabricating the structure of FIGS. 8a and 8b.

FIGS. 8a and 8b show one embodiment of a two-transistor EEPROM cell 200 constructed in accordance with the teachings of this invention. FIG. 8a is a top view of cell 200 and FIG. 8b is a cross-sectional view drawn along the line AA of FIG. 8a. P type substrate 307, N type source region 106, N type drain 104, word line 103, electrical contact 107, and transistor channel 110 form a MOSFET 201 used as a "select" transistor 201. The select transistor 201 is used to provide the selective writing, erasing and reading of cell 200, in a manner which is well known in the prior art. The left sides of FIGS. 8a and 8b show the memory MOSFET 202, having a floating gate 101 capable of storing a charge representing the data stored in cell 200. Partially relaxable dielectric 102, comprising a sandwich of silicon-rich $SiO_2/SiO_2$/silicon-rich $SiO_2$, is incorporated between floating gate 101 and control gate 100.

To program the cell 200 to a logical one, high voltages (typically 15 volts) are selectively applied to both word line 103 and metal bit line 109 which makes contact with drain 104 of the select transistor 201. The high voltage on drain 104 is transferred through channel 110 to N type source region 106. Control gate 100 is connected to ground. Partially relaxable composite dielectric 102 provides high capacitive coupling between the polysilicon control gate 100 and polysilicon floating gate 101. Therefore, floating gate 101 is capacitively coupled to ground. Tunnel oxide 105 between N type region 106 (high voltage) and floating gate 101 (near ground) allows electrons to tunnel out of floating gate 101 through tunneling dielectric 105 into N type region 106, thereby programming the memory transistor 202 with a positive charge on floating gate 101. After programming of memory transistor 202, the positive charge is retained on floating gate 101 (unless erased) for an extremely long period of time, typically ten years. The positive charge stored on floating gate 101 decreases the control gate threshold voltage of memory transistor 202. This decreased threshold voltage denotes a logical zero.

To erase the memory transistor 202, drain 104 is connected to ground, and a high voltage is applied to word line 103 and control gate 10; floating gate 101 is capacitively coupled to the high voltage on control gate 100. The low drain 104 voltage is applied through channel 110 to N type region 106 and erasing occurs as electrons are injected from N type region 106, through tunnel dielectric 105, into floating gate 101. Thus, floating gate 101 becomes negatively charged, raising the control gate threshold voltage of memory transistor 202. This high threshold voltage denotes a logical one.

One process for fabricating devices in accordance with this invention will be described with reference to FIGS. 9-17. Silicon substrate 109 is covered by a base layer of silicon dioxide 120 having a thickness of 400-1000 angstroms. Hereinafter, the entire structure at various stages in the fabrication process will be referred to as a "wafer". Base oxide 120 is formed, for example, by oxidizing the wafer in a wet oxygen atmosphere at approximately 920° C. for approximately 15-30 minutes. A layer of nitride (not shown) is then deposited on top of the base oxide 120 to a thickness of 400-1500 Å, for example, by conventional chemical vapor deposition. Well known photolithographic and etching techniques are then are used to pattern the nitride layer to define areas in which active devices are to be formed. Channel stops 122 are then formed, for example by the ion implantation of boron at approximately 80 KEV to a dosage of approximately $10^{13}$ atoms/cm$^2$. Field oxide 121 is grown to a thickness of approximately 1 micron, for example, by oxidation in wet oxygen at approximately 900° C. for approximately 20 hours. The remaining portions of the masking nitride are then removed, for example by etching with phosphoric acid, providing the structure shown in FIG. 9.

Figure 10:
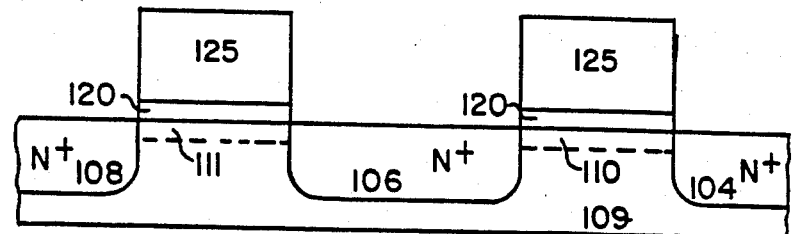

Referring to FIG. 10 (field oxide 121 is not shown in FIGS. 10-17 for simplicity), a photoresist pattern 125 is used in a well known manner to define transistor channels 110 and 111, and the exposed portions of base oxide 120 are removed, for example by etching with buffered HF. The exposed surface of the wafer is then doped to form heavily doped N regions 104, 106 and 108, for example by ion implantation of arsenic at approximately 100 KEV to a dosage of approximately $10^{16}$ atoms/cm$^2$.

Figure 11:
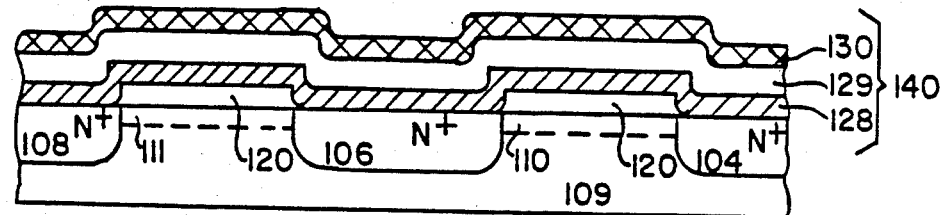

Referring to FIG. 11, photoresist 125 is removed, followed by the sequential formation of three layers: 150 Å silicon-rich SiO$_2$ layer 128, 100 Å SiO$_2$ layer 129, and 150 Å silicon-rich SiO$_2$ layer 130, thereby forming composite dielectric layer 140. The atomic percent of silicon in silicon-rich SiO$_2$ layers 128 and 130 is typically in the range of 40% to 65%. In one embodiment, the deposition process utilizes chemical vapor deposition (CVD) methods. By properly adjusting the ratio of the reacting gases, SiH$_4$ and N$_2$O, at a deposition temperature of 700° C., all three layers are deposited in one CVD run. For instance, a SiH$_4$/N$_2$O ratio within the range of 3:1 to 10:1 can be used. Another method of forming the composite dielectric layer 140 is Low Pressure CVD, which gives better uniformity and higher through-put.

After deposition of composite dielectric layer 140, a layer 133 (FIG. 12) of approximately 1000 Å undoped polysilicon is formed, for example by low pressure CVD. A layer 134 of approximately 500 Å silicon nitride (Si$_3$N$_4$) is then formed, for example by low pressure CVD. Polysilicon layer 133 is preferably deposited by the decomposition of SiH$_4$ gas in the same CVD reactor as is used to form composite dielectric layer 140. Polysilicon layer 133 serves as a buffer layer between nitride layer 134 and underlying silicon-rich SiO$_2$ layer 130. This buffer layer 133 protects Si-rich SiO$_2$ layer 130 from contamination and chemical attack during later etching of masking nitride layer 134. Top nitride layer 134 is used to define tunnel dielectric 140 in a novel "self-aligned" fashion, as described below. Transistor channel regions 110 and 111 are protected by base oxide 120 from contamination from silicon-rich SiO$_2$ layer 128 which otherwise is in direct contact with the surface of channels 110 and 111.

Figure 12:
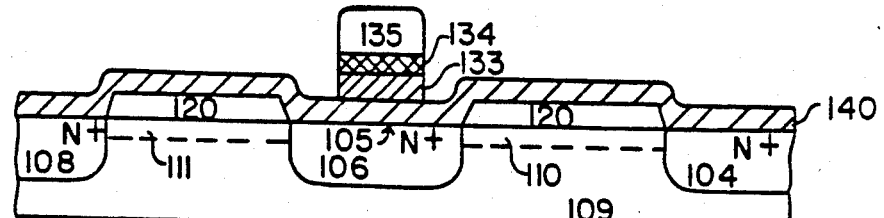
Figure 13:
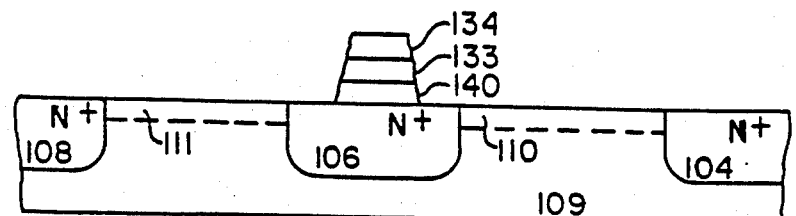

Referring to FIG. 12, photoresist layer 135 is formed and patterned in a well known manner to cover nitride layer 134 and undoped polysilicon layer 133 where tunnel dielectric 140 is to be formed. The exposed nitride and polysilicon layers are then removed, for example, by plasma etching using CF$_4$ and O$_2$ plasmas, respectively, at 25° C. Remaining portions of photoresist 135 are then removed in a well known manner. The wafer is then thermally oxidized in wet or dry oxygen, thereby causing that portion of composite dielectric layer 140 which is exposed to be converted to pure SiO$_2$. The part of composite dielectric layer 140 which is protected by nitride layer 134 and polysilicon layer 133 is unaffected by this oxidation step because silicon nitride is oxidation resistant. Converted portions of composite dielectric layer 140 and the remaining base oxide 120 are then removed, for example by etching with a 10% HF solution at 23° C., leaving tunnel dielectric 140 under nitride layer 134 and polysilicon layer 133 (FIG. 13).

Figure 14:
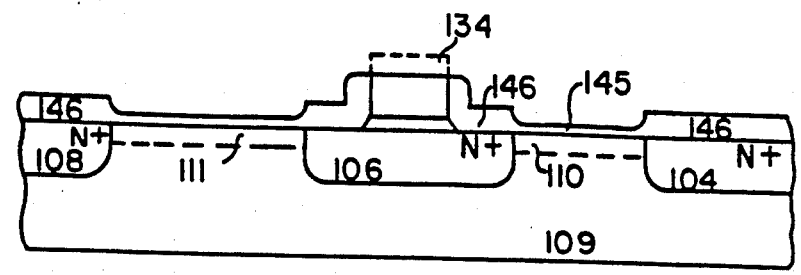

Referring now to FIG. 14, with the remaining portion of nitride layer 134 protecting polysilicon layer 133 from oxidation, gate oxide layer 145 is formed on exposed portions of the surface of channels 110 and 111 to a thickness of approximately 400 Å, for example by oxidation in wet O$_2$ at approximately 900° C. for approximately 40 minutes. Gate oxide 145 is also grown simultaneously over the heavily doped N regions 104, 106 and 108 and tends to be thicker (i.e. approximately 1000 Å) than the gate oxide 145 over the channel due to the increased oxidation rate of regions 104, 106 and 108 due to the presence of dopants therein. Nitride layer 134 is then removed, for example by etching with hot phosphoric acid at approximately 160° C. for approximately 10 minutes. Gate oxide 145 and polysilicon 133 have very low etch rates in phosphoric acid compared to nitride (i.e. approximately 20 Å/minute for nitride versus less than 1 Å/minute for oxide and poly), and thus are unaffected by the etching of nitride 134.

Of importance, the use of nitride layer 134 and polysilicon 133 to define tunnel dielectric 140 has several advantages. For instance, there is no overlap of gate oxide 145 and tunnel dielectric 140; i.e., tunnel dielectric 140 is "self-aligned" to gate oxide 145. Overlap regions not only waste cell area but also cause reliability problems due to charge trapping effects. A further advantage is that the silicon-rich SiO$_2$/SiO$_2$/silicon-rich SiO$_2$ composite tunnel dielectric 140 (FIGS. 11-14), which is made of ultra thin films (approximately 100-150 Å thick) and is extremely sensitive to contamination and physical or chemical damage, is always protected during processing by a polysilicon buffer layer 133 (FIGS. 11-14). Furthermore gate oxide layer 145 is formed independently of the formation of composite dielectric layer 140 and polysilicon layer 133, which provides gate oxide layer 145 having much better quality as compared to gate oxide layers formed by other methods, for example, where undesired portions of composite dielectric layer 140 are removed from the top of gate oxide 120 (FIG. 12) without using the above mentioned technique.

Figure 15:
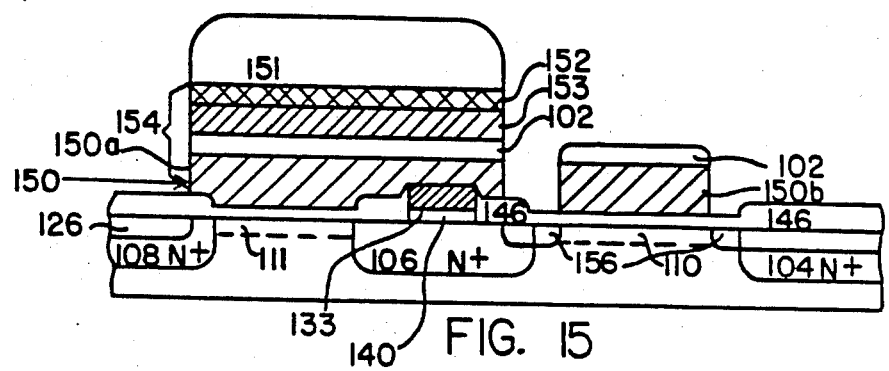
Figure 16:
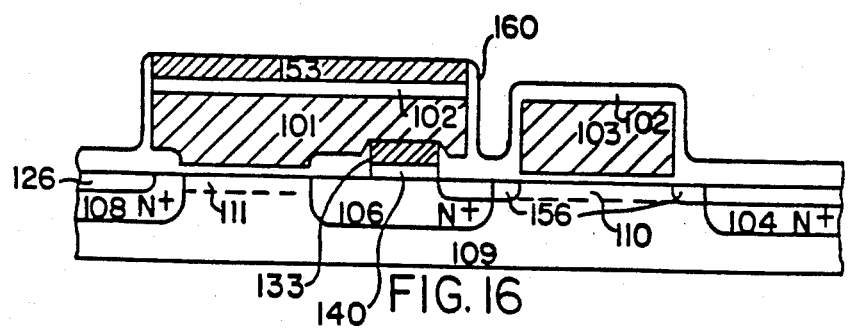

Referring to FIG. 15, polysilicon layer 150 is then formed to a thickness of approximately 3000 Å, for example by CVD using SiH$_4$ gas at approximately 620° C. Poly layer 150 is then doped with, for example, phosphorus in a well known manner to reduce its resistivity to approximately $1 \times 10^{-3}$ ohm-cm. Partially relaxable composite dielectric structure 102 is then formed on doped polysilicon layer 150. In one embodiment of this invention, composite dielectric structure 102 is formed of three layers consisting of 150 Å silicon-rich $SiO_2$, 100 Å $SiO_2$ and 150 Å silicon-rich $SiO_2$, although other thicknesses and materials can be used in accordance with the teachings of this invention. The silicon-rich $SiO_2$ films are similar to those used to form composite tunnel dielectric 140. In one embodiment of this invention, more silicon atoms are incorporated into the silicon-rich $SiO_2$ layers of composite dielectric 102 (e.g. 60% silicon) than the silicon-rich $SiO_2$ tunnelling dielectric 140 (e.g. 50% silicon), thus minimizing the relaxation time of dielectric layer 102 by increasing the conductivity of the silicon-rich $SiO_2$ layers within dielectric layer 102 due to their high silicon content.

A 1000 Å undoped polysilicon layer 153 and a 500 Å layer of silicon nitride 152 are formed on top of dielectric 102 by, for example, LPCVD. A layer of photoresist (not shown) is formed and patterned in a well known manner to define floating gate 101. Unmasked portions of nitride layer 152 are removed, for example by etching with hot phosphoric acid. Unmasked portions of poly layer 153 and oxide 102 are then removed, for example by etching with $O_2$ plasma and buffered HF, respectively. A second photoresist layer 151 is then formed to define floating gate 101 and control gate 103. Unmasked portions of poly layer 150 are then removed, for example by plasma etching with $O_2$ gas. Of importance, polysilicon layer 133 remaining on top of tunnel dielectric 140 is doped by and becomes part of polysilicon layer 150a, which in turn becomes floating gate 101. Portion 150b of polysilicon layer 150 forms word line 103.

Additional N type regions 156 are formed, for example by the ion implantation of arsenic at approximately 100 KEV to a dosage of approximately $10^{16}$ atoms/cm$^2$, thereby connecting the gap between N type region 106 and word line 103, and the gap between word line 103 and N type region 104. Photoresist 151 is then removed in a well known manner.

Oxide 160 (FIG. 16) is then formed to a thickness of approximately 2000 Å by, for example, thermal oxidation in wet oxygen at approximately 800° C., for approximately 100 minutes. Nitride 152 is oxidation resistant and is not oxidized during the formation of sidewall oxide 160. Nitride 152 is then removed, for example by etching with hot phosphoric acid.

Figure 17:
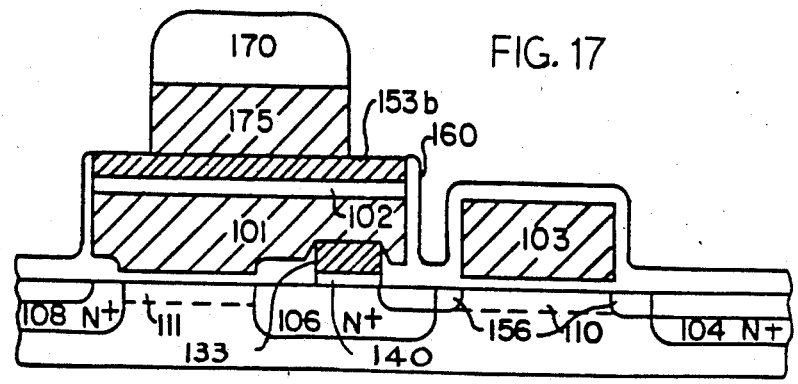

Polysilicon layer 175 (FIG. 17) is then formed, for example by LPCVD and doped, for example with phosphorus to reduce its resistivity to approximately $1 \times 10^{-3}$ ohm-cm. Photoresist 170 is formed and patterned in a well known manner to define the desired interconnect pattern of polysilicon layer 175, as shown in FIG. 17. Exposed portions of polysilicon 175 are then removed, for example by etching with $CF_4$ plasma at 25° C. and resist 170 is then removed in a well known manner. Oxidation of polysilicon layer 175 passivates layer 175 and also oxidizes exposed portions of undoped polysilicon layer 153a. Unexposed polysilicon layer 175 and, together with polysilicon layer 175, forms control gate 100 of the structure shown in FIG. 8b.

Typical processing steps are then employed, for instance, doped glass deposition, contact doping, glass reflow and metal interconnect deposition and patterning. The completed structure is shown in FIG. 8b. Either polysilicon layer 100 or polysilicon layer 101 is used as a FET gate in peripheral circuits, as desired. Conventional steps utilized in the fabrication of integrated circuit memory products, such as threshold adjustment implants, buried contacts, etc. are not described for brevity but are easily understood to those of ordinary skill in the art.

While specific embodiments of this invention have been presented in the specification, these specific embodiments are intended to serve by way of example only and are not to be construed as limitations on the scope of this invention. Numerous other embodiments of this invention will become readily apparent to those with ordinary skill in the art in light of the teachings of this specification.

I claim:

1. A Programmable Read Only Memor device comprising:
   a semiconductor substrate;
   a source formed within said semiconductor substrate;
   a drain formed within said semiconductor substrate;
   a channel region formed within said semiconductor substrate between said source and said drain;
   a gate dielectric formed on said channel region;
   a floating gate located above said channel region and spaced apart from said channel region by said gate dielectric;
   a control gate lcoated above said floating gate and separated therefrom; and
   a partially relaxable dielectric formed between said control gate and said floating gate for capacitively coupling said floating gate and said control gate, said partially relaxable dielectric comprising a first portion comprising a silicon-rich dielectric located adjacent said control gate, a second portion comprising a silicon-rich dielectric located adjacent said floating gate, and a third portion comprising a dielectric located between said first and second portions, said first and second portions being formed to have conductivities such that application of an electric field having a magnitude greater than a predetermined value between said control gate and said floating gate causes said first and second portions of said partially relaxable dielectric to behave electrically as parts of said control gate and said floating gate, respectively, such that said capacitive coupling between said control gate and said floating gate increases whenever said electric field between said control gate and said floating gate exceeds said predetermined value such that said partially relaxable dielectric serves as a dielectric equivalent to said third portion, said gate oxide and said partially relaxable dielectric having capacitances such that voltages applied across said drain and said control gate divide between said partially relaxable dielectric and said gate oxide in a ratio causing electron tunnelling between said drain and said floating gate while preventing electron tunnelling between said control gate and said floating gate.

2. The structure as in claim 1 wherein said first and second layers comprise a silicon-rich oxide of silicon and said third layer comprises an oxide of silicon.

3. The structure as in claim 1 wherein said first and second layers comprise silicon-rich silicon nitride and said third layer comprises an oxide of silicon.

4. The structure as in claim 1 wherein said first and second layers comprise silicon-rich nitride and said third layer comprises silicon nitride.

5. The structure as in claim 1 wherein said gate oxide includes a tunnel dielectric portion, said tunnel dielectric comprising a portion of said gate oxide bounded by said drain and a portion of said floating gate projecting toward said drain such that the distance between said floating gate and said substrate across said tunnel dielectric is less than across the remainder of said gate oxide to permit electric charges to tunnel through said tunnel dielectric between said drain and said floating gate.

6. The structure as in claim 2 wherein said first and second layers comprise approximately 40 to 65 atomic percent silicon.

7. The structure as in claim 2 wherein said first and said second layers each have thickness within the range of approximately 150 Å to 500 Å.

8. The structure as in claim 2 wherein said third layer has a thickness within the range of approximately 100 Å to 300 Å.

9. The structure as in claim 5 wherein said tunnel dielectrics portion comprises a second partially relaxable dielectric, including a first layer adjacent said floating gate, a second layer adjacent said drain, and a third layer comprising a dielectric between said first and second layers for enhancing tunnel current between said floating gate and said drain during programming and erasing of said Programmable Read Only Memory device.

10. The structure as in claim 9 wherein said first and second layers of said second partially relaxable dielectric comprise approximately 40 to 65 atomic percent silicon.

11. The structure as in claim 9 wherein said first and second layers of said second partially relaxable dielectric have thicknesses within the range of approximately 150 Å to 500 Å.

12. The structure as in claim 9 wherein said third layer of said second partially relaxable dielectric has a thickness within the range of approximately 100 Å to 300 Å.

13. The structure as in claim 9 wherein said second partially relaxable dielectric comprises:
 a first layer of a silicon-rich oxide of silicon;
 a second layer of a silicon-rich oxide of silicon; and
 a third layer of an oxide of silicon located between said first and said second layers.

14. The structure as in claim 9 wherein said second partially relaxable dielectric comprises:
 a first layer of silicon-rich silicon nitride;
 a second layer of silicon-rich silicon nitride; and
 a third layer of silicon nitride located between said first and second layers.

15. The structure as in claim 9 wherein said second partially relaxable dielectric comprises:
 a first layer of silicon-rich silicon nitride;
 a second layer of silicon-rich silicon nitride; and
 a third layer of an oxide of silicon located beteween said first and said second layers.

16. The structure as in claims 2, 3, or 4 wherein said partially relaxable dielectric has a relaxation time within the range of approximately 10 to 100 microseconds, where said relaxation time is defined as the time required between the application of a voltage across said first and second layers and the time when approximately 95% of said voltage appears across said third layer.

* * * * *

UNITED STATES PATENT AND TRADEMARK OFFICE
CERTIFICATE OF CORRECTION

PATENT NO. : 4,688,078

DATED : August 18, 1987

INVENTOR(S) : Ning Hsieh

It is certified that error appears in the above-identified patent and that said Letters Patent is hereby corrected as shown below:

ON THE TITLE PAGE:

Inventor: "Ning Hseih" should read --Ning Hsieh--.

References Cited: "365/182X" should read --365/182XR--.

Col. 2, line 42, "supplied" should read --applied--.

Col. 3, line 28, "Angstrom or less,)" should read --Angstroms or less),--.

Col. 3, line 45, "under-" should read --unde---.

Col. 3, line 52, "leat" should read --least--.

Col. 3, line 61, "field" should read --fields--.

Col. 3, line 64, "amy" should read --may--.

Col. 6, line 18, "DESCRIPTION OF THE PREFERRED EMBODIMENTS" should read --DESCRIPTION OF THE PREFERRED EMBODIMENT--.

UNITED STATES PATENT AND TRADEMARK OFFICE
CERTIFICATE OF CORRECTION

PATENT NO. : 4,688,078
DATED : August 18, 1987
INVENTOR(S) : Ning Hsieh

It is certified that error appears in the above-identified patent and that said Letters Patent is hereby corrected as shown below:

Col. 6, line 24, "gion 89" should read --gion 89,--.

Col. 6, line 25, "control gate gate 80" should read --control gate 80--.

Col. 6, line 51, "(mroe" should read --(more--.

Col. 6, line 60, "81 and" should read --81, and--.

Col. 6, line 65, "gate 81 and floating gate 82" should read --gate 80 and floating gate 81--.

Col. 7, line 13, "applicant's" should read --Applicant's--.

Col. 9, line 12, "gate 80" should read --gate 81--.

Col. 9, line 16, "gate 80" should read --gate 81--.

Col. 9, line 45, "obviouis" should read --obvious--.

Col. 10, line 63, "control gate 10" should read --control gate 100--.

UNITED STATES PATENT AND TRADEMARK OFFICE
CERTIFICATE OF CORRECTION

PATENT NO. : 4,688,078
DATED : August 18, 1987
INVENTOR(S) : Ning Hsieh

It is certified that error appears in the above-identified patent and that said Letters Patent is hereby corrected as shown below:

Col. 11, line 8, "angstroms." should read --Angstroms.--.

Col. 11, line 39, "150 Åsilicon-rich" should read --150Å silicon-rich--.

Col. 13, line 59, "25° C and" should read --25° C, and--.

Col. 13, line 62, "Unexposed polysilicon layer 175" should read --Unexposed polysilicon layer 153b is doped by dopant diffusion from polysilicon layer 175--.

Col. 14, line 17, "Memor" should read --Memory--.

Col. 14, line 29, "lcoated" should read --located--.

Col. 15, line 2, "silicon-rich nitride" should read --silicon-rich silicon nitride--.

Col. 16, line 25, "beteween" should read --between--.

Signed and Sealed this

Twenty-eighth Day of March, 1989

*Attest:*

DONALD J. QUIGG

*Attesting Officer*     *Commissioner of Patents and Trademarks*